(12) United States Patent
Lee et al.

(10) Patent No.: US 9,629,238 B2
(45) Date of Patent: Apr. 18, 2017

(54) DISPLAY DEVICE

(71) Applicant: Samsung Display Co., Ltd., Yongin-si, Gyeonggi-Do (KR)

(72) Inventors: Dong Hyeon Lee, Seoul (KR); Lu Ly Lee, Yongin-si (KR); Kwang Wook Choi, Osan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/821,551

(22) Filed: Aug. 7, 2015

(65) Prior Publication Data

US 2016/0088745 A1 Mar. 24, 2016

(30) Foreign Application Priority Data

Sep. 22, 2014 (KR) ........................ 10-2014-0125768

(51) Int. Cl.
*H05K 1/02* (2006.01)
*G02F 1/1333* (2006.01)
*H01J 17/49* (2012.01)

(52) U.S. Cl.
CPC ....... *H05K 1/028* (2013.01); *G02F 1/133308* (2013.01); *H01J 17/49* (2013.01); *G02F 2001/133314* (2013.01)

(58) Field of Classification Search
CPC ... G02F 1/133308; G02F 2001/133314; G02F 2001/13332; G02F 2001/133331; G02F 1/133602; G02F 2001/133317; G02F 2001/133325; G02F 2001/133328; G02F 1/133305; G02F 1/133608; G02F 2201/465; G02F 1/13336; G02F 1/133512; G02F 1/133528; G02F 1/133553; G02F 1/133604; G02F 1/13394; G02F 2001/133322; G02F 2201/46; G02F 2201/503; G06F 1/1637; G06F 1/163; G06F 3/013; G06F 1/1626; G06F 2200/1633; G06F 1/1601; G06F 3/005; G06F 3/011; G06F 3/017; G06F 3/04842; H05K 5/02; H05K 1/028; H05K 5/0017; H05K 5/0204; H05K 5/0217; H01J 17/49

(Continued)

(56) References Cited

U.S. PATENT DOCUMENTS 7,782,419 B2   8/2010   Hahm et al.
7,791,279 B2 * 9/2010   Kwon ................ H01J 5/48
                                              313/582

(Continued)

FOREIGN PATENT DOCUMENTS

JP        2013-242493 A    12/2013
KR   10-2009-0053366 A     5/2009

(Continued)

*Primary Examiner* — Anthony Haughton
*Assistant Examiner* — Ingrid Wright
(74) *Attorney, Agent, or Firm* — Robert E. Bushnell, Esq.

(57) ABSTRACT

A display device includes: a display panel curved in one direction; and a lower frame configured to accommodate the display panel. The lower frame includes: a plurality of bottom portions having a predetermined curvature; a side portion bent and extending from an edge portion of the bottom portion; and at least one connecting unit configured to connect the plurality of bottom portions.

16 Claims, 9 Drawing Sheets

(58) Field of Classification Search
USPC ............ 361/679.21, 679.26, 679.27, 679.08, 361/679.09, 679.22
See application file for complete search history.

(56) References Cited

U.S. PATENT DOCUMENTS

| | | |
|---|---|---|
| 2013/0314638 A1 | 11/2013 | Ahn et al. |
| 2013/0321740 A1 | 12/2013 | An et al. |
| 2014/0009914 A1 | 1/2014 | Cho et al. |
| 2015/0017393 A1* | 1/2015 | Oh .................... G02F 1/133308 428/177 |
| 2015/0036077 A1* | 2/2015 | Lee ......................... H05K 5/02 349/65 |
| 2015/0062480 A1* | 3/2015 | Cho .................. G02F 1/133308 349/58 |

FOREIGN PATENT DOCUMENTS

| | | |
|---|---|---|
| KR | 10-2009-0070132 A | 7/2009 |
| KR | 10-2013-0117110 A | 10/2013 |
| KR | 10-1319543 B1 | 10/2013 |
| KR | 10-2013-0132232 A | 12/2013 |
| KR | 10-2014-0007202 A | 1/2014 |
| KR | 10-2014-0017161 A | 2/2014 |

* cited by examiner

DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 22 Sep. 2014 and there duly assigned Serial No. 10-2014-0125768.

BACKGROUND OF THE INVENTION

Field of the Invention

Aspects of embodiments of the present invention relate to a display device including a split-type fixing frame.

Description of the Related Art

Display devices are categorized into a liquid crystal display (LCD) device, an organic light emitting diode (OLED) display device, a plasma display panel (PDP) device, an electrophoretic display (EPD) device, and the like according to a light emitting method.

In recent years, as a screen size of the display device is increased, a viewing angle difference has become disadvantageously increased between cases where a viewer looks at a center portion, and looks at left and right end portions of a screen. That is, when an image displayed on a screen is viewed from a position corresponding to the center portion of a large display device, a viewer may clearly recognize an image at the center portion of the screen; however, the viewer may not clearly recognize images at left or right sides.

In order to compensate for this viewing angle difference, a curved display has been developed, in which right and left end portions are concavely curved with respect to the center portion of a screen. The curved display devices may be categorized into two types: a portrait type having a longer vertical length than a horizontal length and curved in a vertical direction; and a landscape type having a longer horizontal length than a vertical length and curved in a horizontal direction.

A curved display device may be manufactured by combining display panels having a flat form to a fixing frame having a curved form. The fixing frame may be manufactured to have a predetermined curvature by press molding and the like, and then fixed by a bracket and the like to maintain the predetermined curvature.

Meanwhile, in accordance with an increase in size of curved display devices, desired curvature and depth of curvature of a fixing frame have become also increased. The depth of curvature refers to a depth between the lowest point and the highest point of the fixing frame.

However, a conventional press molding apparatus has a limit to a stroke (a distance between a top dead center of a bottom die and a bottom dead center of a top die), and thus there has been a limit in manufacturing a fixing frame having a depth of curvature larger than a predetermined size.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY OF THE INVENTION

Embodiments of the present invention direct to manufacturing fixing frames having various sizes of curvatures and depths of curvatures without imposing changes on existing apparatuses.

According to an embodiment of the present invention, a display device includes: a display panel curved in one direction; and a lower frame configured to accommodate the display panel. The lower frame includes: a plurality of bottom portions having a predetermined curvature; a side portion bent and extending from an edge portion of the bottom portion; and at least one connecting unit configured to connect the plurality of bottom portions.

The connecting unit may have a predetermined curvature.

The connecting unit may have substantially the same curvature as the bottom portion.

The connecting unit may have a groove into which the bottom portion is inserted.

The lower frame may have a height difference between an end portion of the bottom portion inserted to the groove and the bottom portion.

The lower frame may include: a plurality of bottom portions having a predetermined curvature; a side portion bent and extending from the edge portion of the bottom portion; and a connecting unit including a first connecting unit configured to connect the plurality of bottom portions and a second connecting unit configured to connect the side portions.

The first and second connecting units may have grooves into which the bottom portion and the side portion are respectively inserted.

The display device may further include a coupling member configured to fix the bottom portion inserted into the groove.

The connecting unit may be integrally formed by press molding.

The connecting unit may include at least one of aluminum (Al), iron (Fe), stainless steel, and alloys thereof.

According to embodiments of the present invention, fixing frames having various sizes of curvatures and depths of curvatures can be manufactured without imposing changes on the existing apparatuses. Further, a fixing frame improved in strength compared to a conventional fixing frame may be manufactured.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
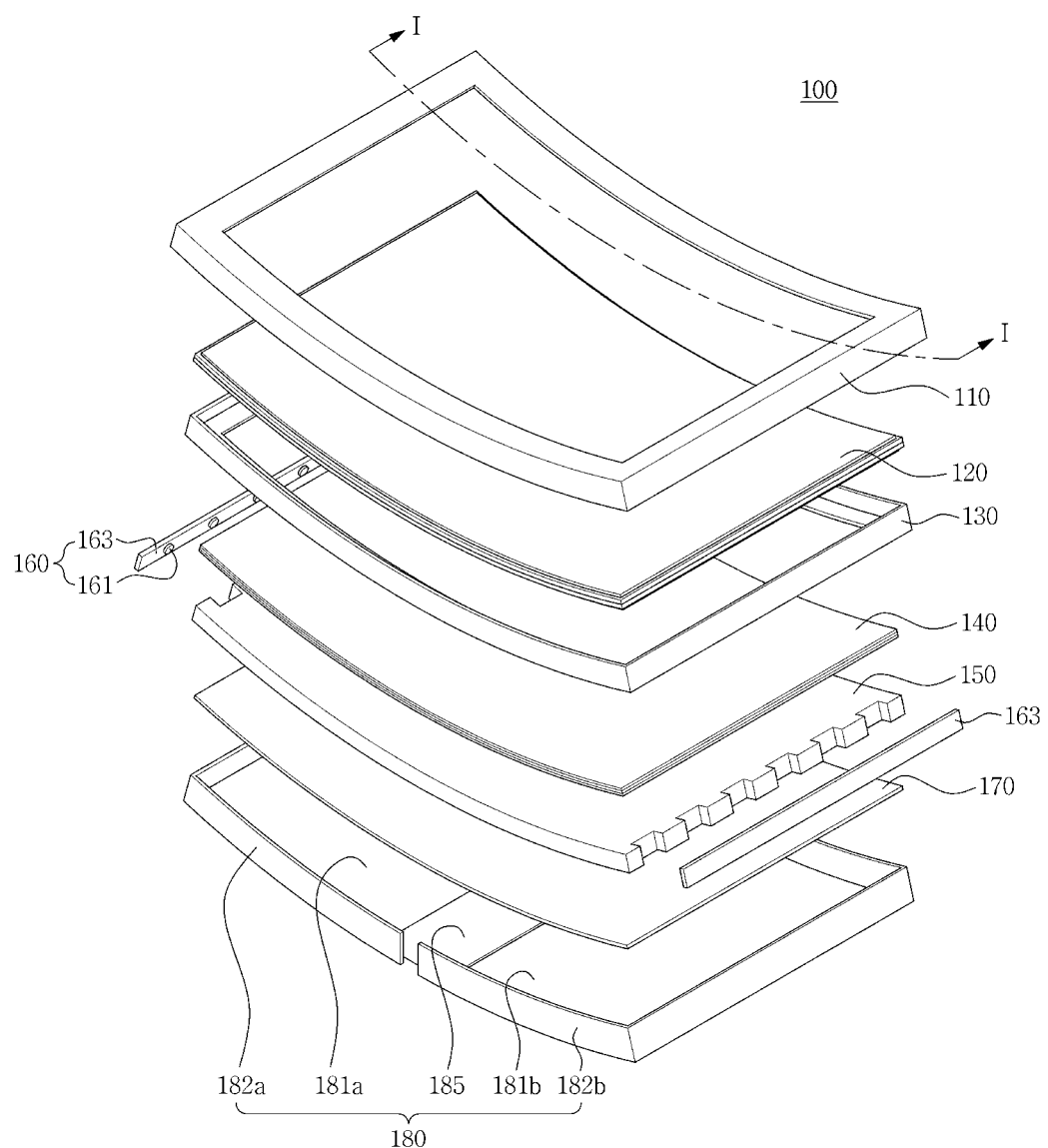
FIG. 1 is an exploded perspective view illustrating a display device according to an embodiment of the present invention.

Hereinafter, embodiments of the present disclosure of invention will be described in more detail with reference to the accompanying drawings.

Although the present invention can be modified in various manners and have several embodiments, specific embodiments are illustrated in the accompanying drawings and will be mainly described in the specification. However, the scope of the embodiments of the present invention is not limited to the specific embodiments and should be construed as including all the changes, equivalents, and substitutions included in the spirit and scope of the present invention.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Some of the parts which are not associated with the description may not be provided in order to specifically describe embodiments of the present invention, and like reference numerals refer to like elements throughout the specification.

Hereinafter, a display device is described as a landscape type where a display panel is transversally longer than it is longitudinally and curved in a transverse direction, but is not limited thereto.

The display device is described as a LCD panel, but is not limited thereto. In some embodiments, the display panel may be an OLED panel.

Further, the display device is described as including an edge type backlight unit, but is not limited thereto. In some embodiments, the backlight unit may be a direct type or a corner type.

Figure 2:
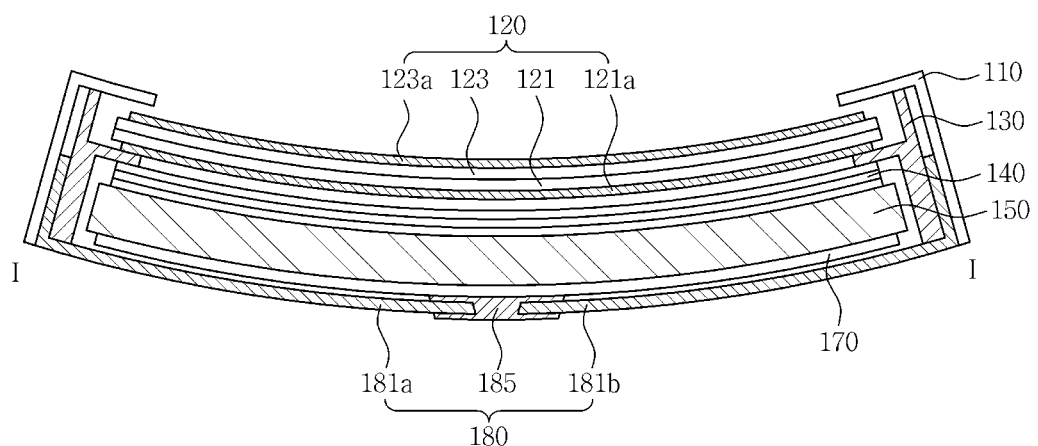
FIG. 2 is a cross-sectional view taken along line I-I of FIG. 1.

FIG. 1 is an exploded perspective view illustrating a display device according to an embodiment of the present invention, and FIG. 2 is a cross-sectional view taken along line I-I of FIG. 1. It is assumed that a landscape type display device including an edge type backlight unit is used as a display device 100 according to an embodiment of the present invention.

In reference to FIGS. 1 and 2, the display device 100 according to an embodiment of the present invention may include an upper frame (or a top chassis) 110, a display panel 120, a middle frame (or a mold frame) 130, an optical sheet 140, a light guide plate 150, a light source unit 160, a reflective sheet 170, and a lower frame (or a bottom chassis) 180. Hereinafter, a backlight unit is defined as a concept including the middle frame 130, the optical sheet 140, the light guide plate 150, the light source unit 160, the reflective sheet 170, and the lower frame 180. The above-listed elements may have a concavely curved form in accordance with a curved surface.

A fixing frame including the upper frame 110, the middle frame 130, and the lower frame 180 may be manufactured to have a predetermined curvature. The display panel 120 may have a curved form before coupled to the fixing frame or after coupled to the fixing frame.

That is, a flexible-type display panel 120 may have a curved form after coupled to the fixing frame and a rigid-type display panel 120 may have a predetermined curvature before inserted into the fixing frame. The display panel 120 may be generally manufactured into a flat form and become to have a predetermined curvature when coupled to the fixing frame. The fixing frame may have a radius of curvature of about 1000 mm to 5000 mm.

The upper frame 110 may have an opening window for exposing an active area of the display panel 120 outwards and may be disposed to cover an edge portion of an upper surface and side portions of the display panel 120.

The upper frame 110 may be configured to fix the edge portion of the upper surface of the display panel 120 and prevent the display panel 120 from being separated from the backlight unit. The upper frame 110 may be fixed to the middle frame 130 and the lower frame 180. The upper frame 110 may be fixed to the middle frame 130 and the lower frame 180 by hooks and/or screws.

The upper frame 110 may be formed of a rigid metal material such as stainless steel or a heat-dissipating material such as aluminum or an aluminum alloy. The upper frame 110 may be formed by a mold press process and the like to have a predetermined curvature.

The display panel 120 is configured to display an image using light and may have a quadrangular panel form. The display panel 120 may be a flexible panel which is bendable in at least one direction. In the display panel 120, two relatively longer sides (hereinafter long sides) may have a concavely curved form having a predetermined curvature and two relatively shorter sides (hereinafter short sides) may have a straight form. In other embodiments, the short sides may have a concavely curved form having a predetermined curvature and long sides may have a straight form.

The display panel 120 may include a first substrate 121, a second substrate 123 opposed to the first substrate 121, and a liquid crystal layer (not illustrated) disposed between the first and second substrates 121 and 123.

The first substrate 121 may include a plurality of pixel electrodes arranged in a matrix form, a thin film transistor configured to apply a driving voltage to the respective pixel electrodes, and various signal lines configured to drive the pixel electrodes and the thin film transistor.

The second substrate 123 may be disposed to face the first substrate 121 and include a common electrode formed of a transparent conductive material and a color filter. The color filter may have types of red, green, and blue color filters.

The liquid crystal layer (not illustrated) may be interposed between the first and second substrates 121 and 123 and rearranged in accordance with an electric field formed between the pixel electrode and the common electrode. Accordingly, the rearranged liquid crystal layer may adjust transmittance of light emitted from the backlight unit and the adjusted light may pass through the color filter, such that an image can be displayed.

In addition, lower and upper polarizers 121a and 123a may be respectively disposed on a bottom surface of the first substrate 121 and on an upper surface of the second substrate 123. The lower and upper polarizers 121a and 123a may have surface areas corresponding to the display panel 120. The upper polarizer 123a may only allow light having a predetermined polarization direction among light incident from the outside to pass through, and absorb or block other light. The lower polarizer 121a may only allow light having a predetermined polarization direction among light emitted from the backlight unit to pass through, and absorb or block other light.

A driving circuit substrate (not illustrated) may be disposed on at least one side of the display panel 120 to drive the display panel 120. The driving circuit substrate may apply various control and power signals to drive the display panel 120.

The middle frame 130 may have a quadrilateral-loop shape. The middle frame 130 may support the display panel 120 and accommodate the optical sheet 140, the light guide plate 150, and the like. The middle frame 130 may be integrally formed as a single unit but may include a plurality of units, where necessary.

The middle frame 130 may be formed of a flexible material such as plastics so as to prevent damage on the display panel 120. The middle frame 130 may be formed by an injection molding process and the like so as to have a predetermined curvature. A detailed configuration of the middle frame 130 will be described below.

The optical sheet 140 may be disposed on the light guide plate 150 and may diffuse and/or collect light directed from the light guide plate 150. The optical sheet 140 may include a diffusion sheet, a prism sheet, and/or a protective sheet. The diffusion sheet, the prism sheet, and the protective sheet may be sequentially laminated on the light guide plate 150 in the order listed.

The prism sheet may collect light guided by the diffusion sheet 150, the diffusion sheet may diffuse light collected by the prism sheet, and the protective sheet may protect the prism sheet. Light leaving the protective sheet may be directed toward the display panel 120.

The light guide plate 150 may uniformly direct light provided from the light source unit 160 to the display panel 120. The light guide plate 150 may be flatly manufactured and coupled to the fixing frame so as to have a predetermined curvature. The light guide plate 150 may be formed of a material that is bendable to have a predetermined curvature.

The light guide plate 150 may include a quadrilateral plate, but is not limited thereto. When light emitting diode (LED) chip is used as a light source, the light guide plate 150 may have various forms including predetermined grooves, protrusions, or the like depending on the position of the light source.

The light guide plate 150 may be referred to as a plate for ease of description but may be in a shape of a sheet or a film, forming a slim display device. In other words, the light guide plate 150 may include the plate and the film for guiding light.

The light guide plate 150 may include a light-transmissive material such as, for example, acrylic resins, such as polymethylmethacrylate (PMMA), or polycarbonate (PC) so as to guide light efficiently.

The reflective sheet 170 may be disposed between the light guide plate 150 and the lower frame 180. The reflective sheet 170 may reflect light emitted downwards from the light guide plate 150 to the display panel 120, and may increase light efficiency.

The light source unit 160 may include a light source 161 and a circuit substrate 163 on which the light source 161 may be disposed.

The light source 161 may be disposed at a corner portion or on a light incident side portion of the light guide plate 150. In other words, the light source 161 may emit light toward the corner portion or the light incident side portion of the light guide plate 150. The light source 161 may include at least one LED chip (not illustrated) and a package (not illustrated) for accommodating the LED chip. For example, the LED chip (not illustrated) may be a gallium nitride (GaN)-based LED chip that emits blue light.

The number of the light source 161 may vary in consideration of size and luminance uniformity of the display panel 120. The circuit substrate 163 may include a printed circuit board (PCB) or a metal PCB.

Although not illustrated, a wavelength converting unit (not illustrated) may be disposed between the light guide plate 150 and the light source unit 160. The wavelength converting unit (not illustrated) may include a substance that can change a wavelength of light. For example, the wavelength converting unit may change a wavelength of blue light emitted from a blue LED light source, so that the blue light may be converted to white light.

Further, a heat dissipating member (not illustrated) may be disposed between the light source unit 160 and the lower frame 180. The heat dissipating member may release heat generated from the light source unit 160 to the outside. When the light source unit 160 is disposed on one side portion of the lower frame 180 in a bar or line shape, a metal frame having a bar or line shape may be disposed as the heat dissipating member. Accordingly, the heat dissipating member may have various shapes depending on the shape of the light source unit 160.

The reflective sheet 170 may include, for example, polyethylene terephthalate (PET), and may reflect light. A surface of the reflective sheet 170 may be coated with a diffusion layer including, for example, titanium dioxide. The reflective sheet 170 may include a material containing metal, such as silver (Ag).

The lower frame 180 may be configured to maintain a framework of the display device and to protect a variety of components accommodated therein. The lower frame 180 may include a plurality of bottom portions 181a and 181b having a predetermined curvature, side portions 182a and 182b extending form edge portions of the bottom portions 181a and 181b and forming an accommodation area for accommodating the display panel, and at least one connecting unit 185 connecting and supporting the plurality of bottom portions 181a and 181b.

The lower frame 180 may include a rigid metal material such as stainless steel or a heat dissipating material such as aluminum or aluminum alloys. The lower frame 180 may be formed by a mold press process and the like so as to have a predetermined curvature. The lower frame 180 may be an integral type having one metal frame form or a split type including a plurality of metal frames coupled to each other. Hereinafter, a split-type lower frame 180 according to an embodiment of the present invention will be described in more detail.

Figure 3:
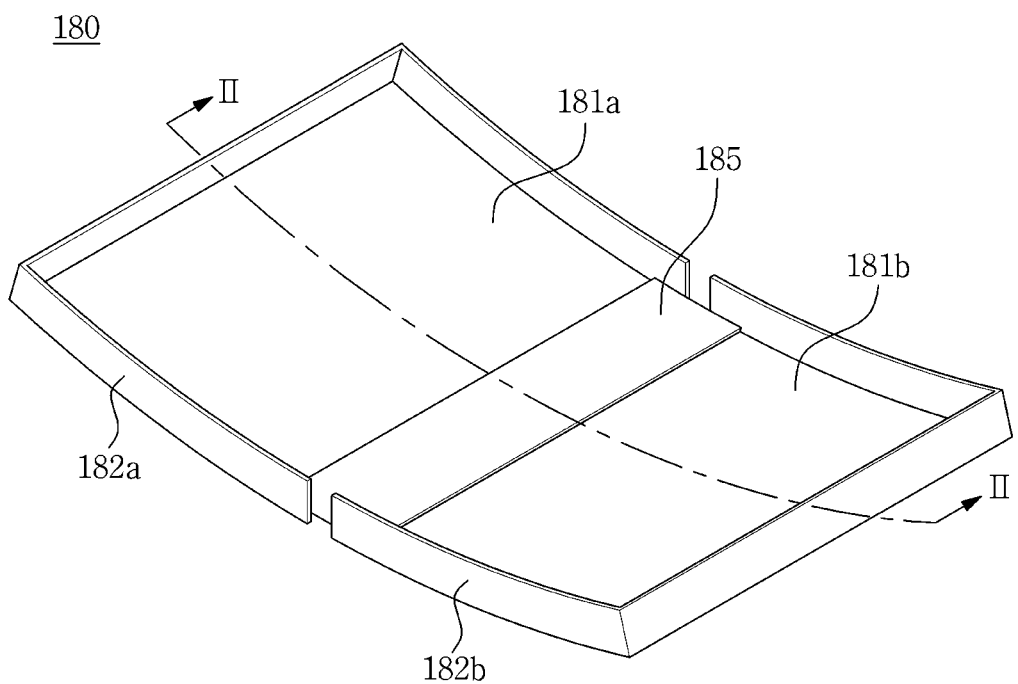
FIG. 3 is a perspective view illustrating a lower frame according to an embodiment of the present invention.
Figure 4A:
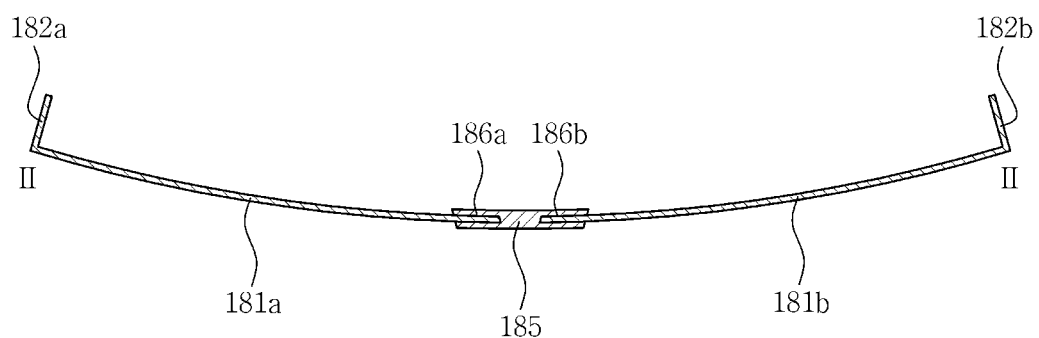
FIG. 4A is a cross-sectional view taken along line II-II of FIG. 3.
Figure 4B:
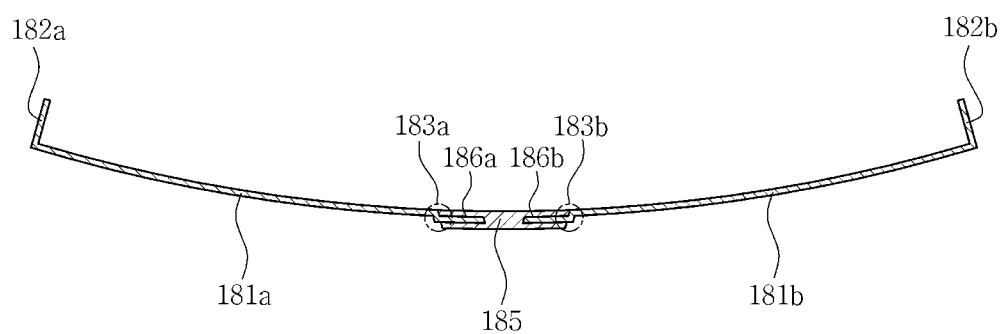
FIG. 4B is a cross-sectional view illustrating a lower frame according to other embodiments of the present invention.
Figure 5:
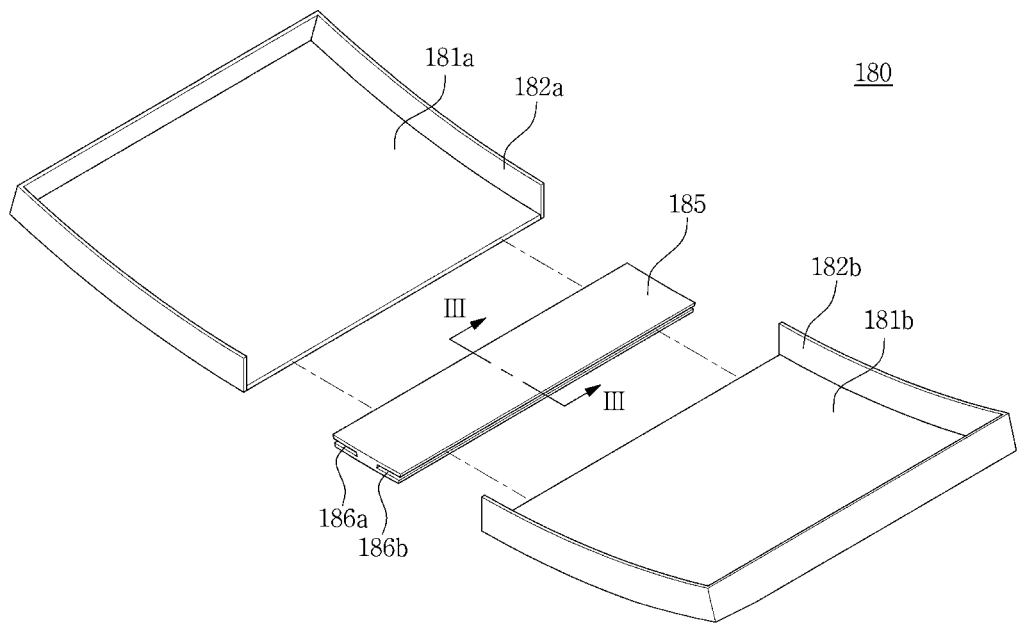
FIG. 5 is an assembly view illustrating a split-type lower frame according to an embodiment of the present invention.
Figure 6:
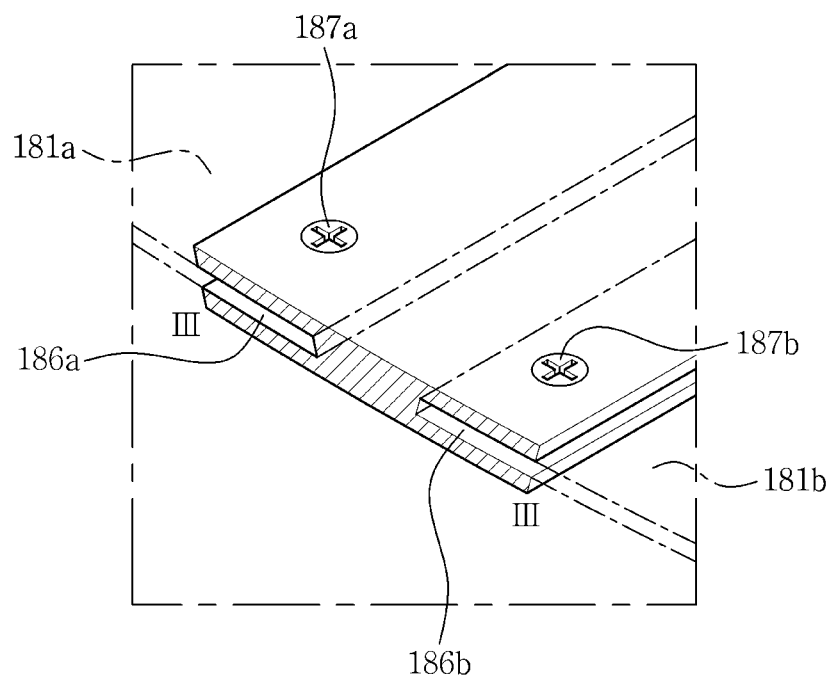
FIG. 6 is a cross-sectional view taken along line III-III of FIG. 5.

FIG. 3 is a perspective view illustrating a lower frame according to an embodiment of the present invention, and FIG. 4A is a cross-sectional view taken along line II-II of FIG. 3. FIG. 4B is a cross-sectional view illustrating a lower frame according to other embodiments of the present invention. FIG. 5 is an assembly view illustrating a split-type lower frame according to an embodiment of the present invention and FIG. 6 is a cross-sectional view taken along line III-III of FIG. 5.

In reference to FIGS. 3 through 6, the lower frame 180 according to an embodiment of the present invention may include a plurality of bottom portions 181a and 181b having a predetermined curvature, side portions 182a and 182b extending form edge portions of the bottom portions 181a and 181b and forming an accommodation area for accommodating the display panel, and at least one connecting unit 185 connecting and supporting the plurality of bottom portions 181a and 181b.

The connecting unit 185 may have a predetermined curvature, and particularly may have substantially the same curvature as the bottom portions 181a and 181b. The connecting unit 185 may include grooves 186a and 186b defined on both sides to allow a part of the bottom portions 181a and 181b to be inserted. The bottom portions 181a and 181b having a predetermined curvature and the connecting unit 185 may have overall one curvature.

When a part of the bottom portions 181a and 181b, as illustrated in FIG. 4A, are inserted into the grooves 186a and 186b of the connecting unit 185, a thickness of the connecting unit 185 may be designed to have the same height as the thickness of the PCB (not illustrated) so as to achieve overall one curvature, thereby maintaining the curvature inside the lower frame smooth.

Further, as illustrated in FIG. 4B, height differences 183a and 183b in a step form are formed at a part of the bottom portions 181a and 181b, thereby allowing the bottom portions 181a and 181b and the connecting unit 185 to have overall one curvature. That is, the height differences 183a and 183b having a lower height than the bottom portions 181a and 181b may be formed at a part of the bottom portions 181a and 181b inserted to the grooves 186a and 186b of the connecting unit 185. In this case, the height of the height differences 183a and 183b may be the same as the thickness of the grooves 186a and 186b.

The connecting unit 185 may be integrally formed by extrusion molding or press processing and may include at least one of aluminum (Al), iron (Fe), stainless steel, and alloys thereof.

In reference to FIG. 6, the lower frame 180 according to an embodiment of the present invention may further include coupling members 187a and 187b configured to fix the bottom portions 181a and 181b inserted into the grooves 186a and 186b of the connecting unit 185. For example, the coupling members 187a and 187b may include coupling bolt and nut, but are not limited thereto. Thus, coupling members used in general can be used without limitation.

Figure 7:
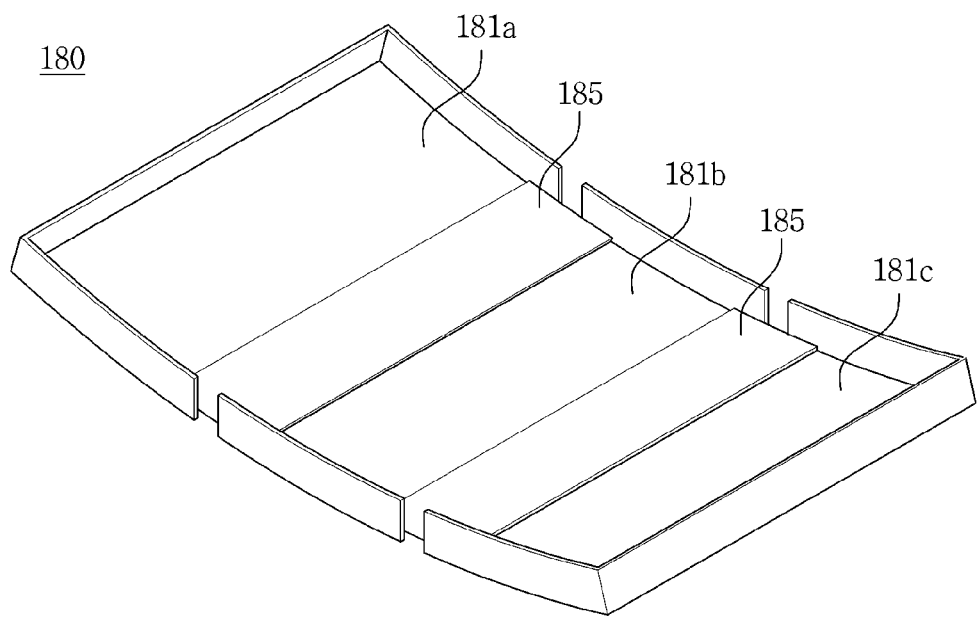
FIGS. 7 and 8 are perspective views illustrating a lower frame according to other embodiments of the present invention.
Figure 8:
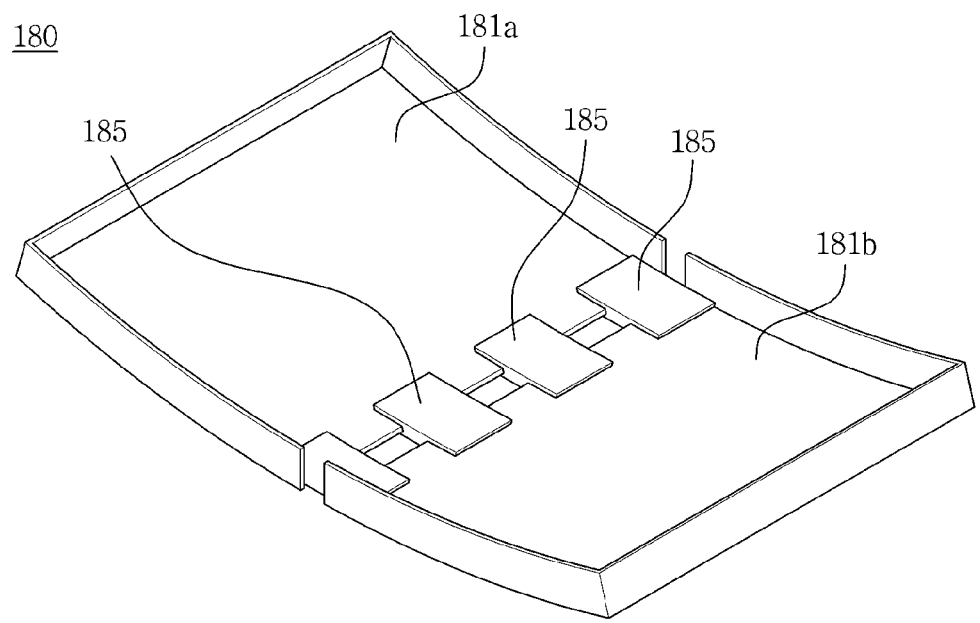

FIGS. 7 and 8 are perspective views illustrating lower frames according to other embodiments of the present invention.

As illustrated in FIG. 7, the lower frame 180 may be partitioned into three bottom portions 181a, 181b, and 181c and, in this case, may include a plurality of connecting units 185 configured to connect and support the respective partitioned bottom portions 181a, 181b, and 181c.

Further, as illustrated in FIG. 8, the lower frame 180 may be partitioned into two bottom portions 181a and 181b and may include a plurality of connecting units 185 configured to connect and support the two bottom portions 181a and 181b.

Accordingly, a lower frame having various sizes and curvatures can be achieved using a plurality of bottom portions and a plurality of connecting units.

Figure 9:
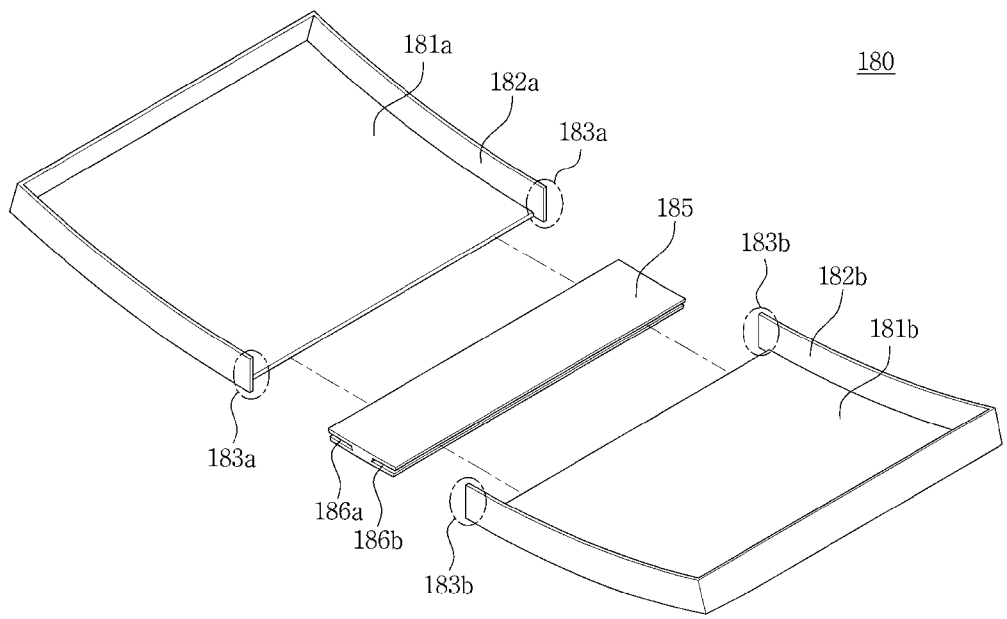
FIGS. 9 and 10 are assembly views illustrating a lower frame according to other embodiments of the present invention.
Figure 10:
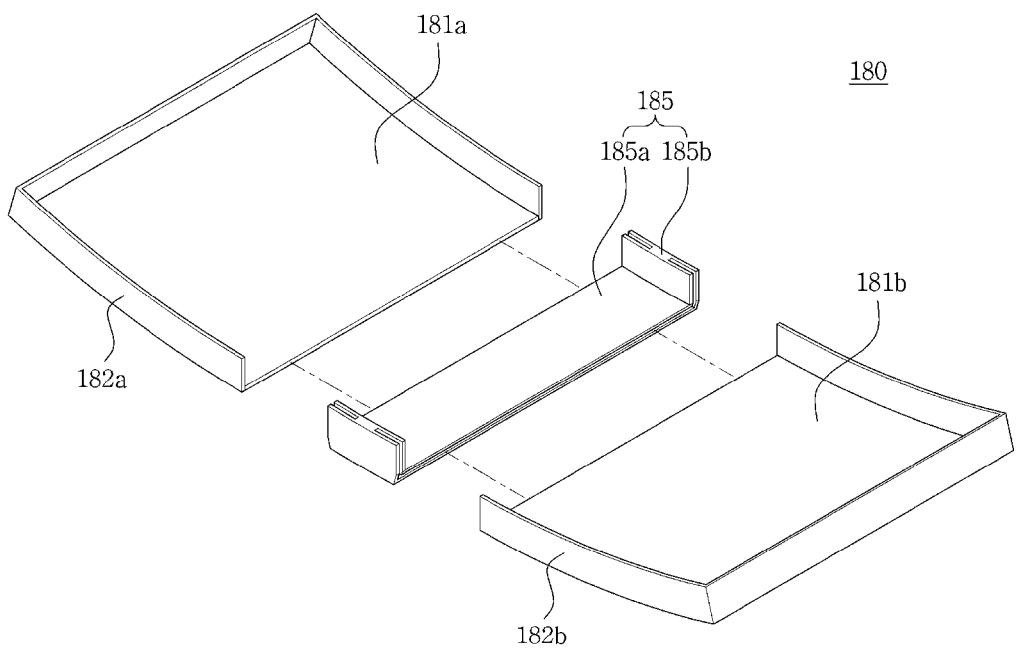

FIGS. 9 and 10 are assembly views illustrating lower frames according to other embodiments of the present invention. The repeated description of the lower frame according to an embodiment of the present invention will be omitted.

In reference to FIG. 9, the lower frame 180 according to another embodiment of the present invention may include a plurality of bottom portions 181a and 181b having a predetermined curvature, side portions 182a and 182b extending from edge portions of the bottom portions 181a and 181b and forming an accommodation area for accommodating the display panel, and at least one connecting unit 185 connecting and supporting the plurality of bottom portions 181a and 181b.

In this case, both end portions 183a and 183b of the partitioned side portions 182a and 182b may be elongated. Such elongated end portions 183a and 183b may compensate for a gap between the side portions 182a and 182b produced by the connecting unit 185. In this case, the end portion 183a is in contact with the end portion 183b.

In reference to FIG. 10, the lower frame 180 according to another embodiment of the present invention may include a plurality of bottom portions 181a and 181b having a predetermined curvature, side portions 182a and 182b extending from edge portions of the bottom portions 181a and 181b and forming an accommodation area for accommodating the display panel, and at least one connecting unit 185 connecting and supporting the plurality of bottom portions 181a and 181b and the side portions 182a and 182b.

The connecting unit 185 may include a first connecting unit 185a connecting and supporting the bottom portions 181a and 181b and a second connecting unit 185b connecting and supporting the side portions 182a and 182b. Grooves may be defined at the respective first and second connecting units 185a and 185b, allowing the bottom portions 181a and 181b and the side portions 182a and 182b to be inserted thereto.

Figure 11A:
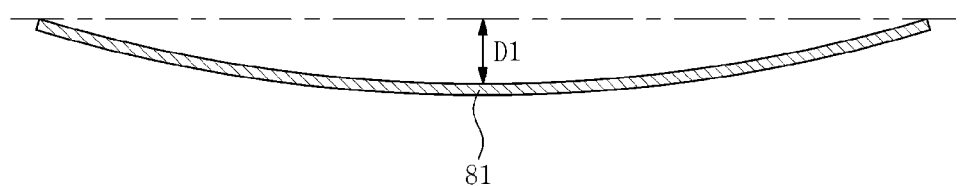
FIGS. 11A and 11B are front views illustrating a conventional lower frame and a lower frame according to an embodiment of the present invention for comparing depths of curvatures.
Figure 11B:
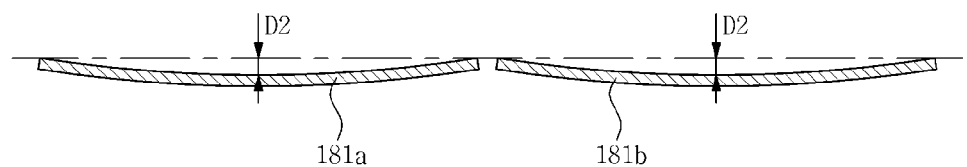

FIGS. 11A and 11B are front views illustrating a conventional lower frame and a lower frame according to an embodiment of the present invention for comparing depths of curvatures.

In reference to FIGS. 11A and 11B, the conventional integral-type lower frame 81 may have increased curvature and depth of curvature D1 in accordance with an increase in size thereof, which inevitably requires modification of the press molding apparatuses. In the case of the split-type lower frames 181*a* and 181*b* according to an embodiment of the present invention, curvature and depth of curvature D2 of the respective lower frames are smaller than the curvature and depth of curvature D1 of the integral-type lower frame, which allows manufacturing of the lower frames 181*a* and 181*b* using the conventional press molding apparatuses. That is, a large lower frame can be manufactured without modification of the conventional press molding apparatuses.

Figure 12A:
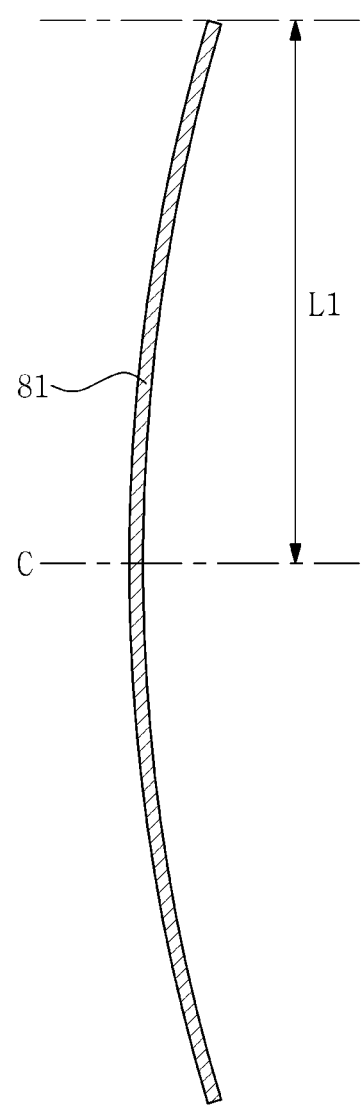
FIGS. 12A and 12B are front views illustrating a conventional lower frame and a lower frame according to an embodiment of the present invention for comparing strength.
Figure 12B:
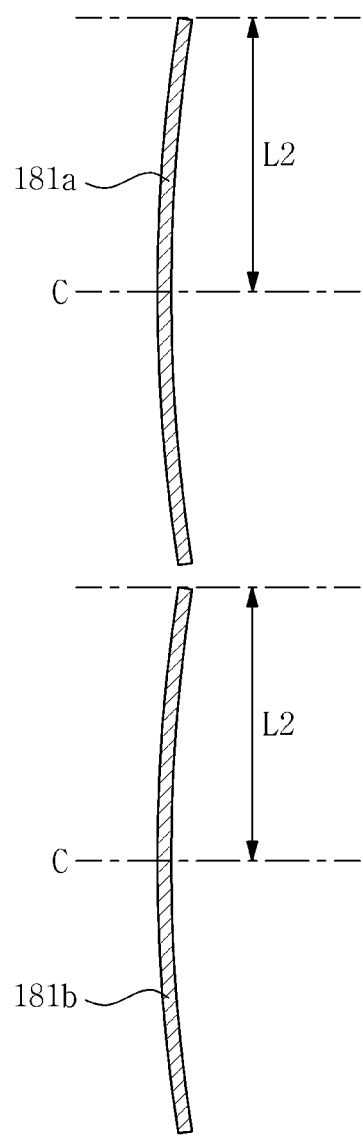

FIGS. 12A and 12B are front views illustrating a conventional lower frame and a lower frame according to an embodiment of the present invention for comparing strength.

Bending strength refers to a maximum stress when a material is bent under load until fracture or yielding and is measured in $kgf/mm^2$ ($N/mm^2$). The bending strength is in inverse proportion to a length of a material from a neutral axis to an end portion.

In reference to FIGS. 12*a* and 12*b*, bending strength of the conventional lower frame 81 may be in inverse proportion to a length L1 from a neutral axis C to an end portion and bending strength of the split-type lower frames 181*a* and 181*b* according to an embodiment of the present invention may be in inverse proportion to a length L2 from a neutral axis C to an end portion. Therefore, when forming an identical curvature, it is advantageous to use the split-type lower frames 181*a* and 181*b* over the conventional integral lower frame 81 in achieving device strength.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

What is claimed is:

1. A display device comprising:
   a display panel curved in one direction; and
   a lower frame configured to accommodate the display panel, wherein the lower frame comprises:
      a plurality of bottom portions having a curvature corresponding to the display panel, each bottom portion having a side portion bent and extending from an edge portion of the bottom portion; and
      at least one connecting unit configured to connect the plurality of bottom portions, the connecting unit comprising a first connecting unit configured to connect the plurality of bottom portions and a second connecting unit configured to connect the side portions.

2. The display device of claim 1, wherein the connecting unit has a curvature corresponding to the display panel.

3. The display device of claim 2, wherein the connecting unit has substantially the same curvature as the bottom portions.

4. The display device of claim 1, wherein the connecting unit has a groove into which a free edge of the bottom portion is inserted.

5. The display device of claim 4, further comprising a coupling member configured to fix the bottom portion to the connecting unit.

6. The display device of claim 4, wherein the lower frame has a height difference between the free edge of the bottom portion inserted to the groove and the rest of the bottom portion.

7. The display device of claim 1, wherein the first and second connecting units have grooves into which a free edge of the bottom portion and a free end of the side portion are respectively inserted.

8. The display device of claim 1, wherein the connecting unit is integrally formed by press molding.

9. The display device of claim 1, wherein the connecting unit comprises at least one of aluminum (Al), iron (Fe), stainless steel, and alloys thereof.

10. A display device comprising:
    a display panel curved in one direction;
    a lower frame configured to accommodate the display panel, the lower frame comprising:
       a plurality of bottom portions having a curvature corresponding to the display panel, each bottom portion having at least one free edge; and
       a side portion orthogonally extending from remaining edge portions of the bottom portion, each side portion having at least one free end;
       a first connecting unit configured to accommodate the free edge of each bottom portion to connect the plurality of bottom portions to each other via the first connecting unit; and
       a second connecting unit orthogonally extending from the first connecting unit, the second connecting unit configured to accommodate the free end of each side portion to connect the side portions to each other via the second connecting unit.

11. The display device as set forth in claim 10, the first connecting unit having insert grooves on opposite edges thereof to respectively accommodate the free edge of each bottom portion.

12. The display device as set forth in claim 10, the second connecting unit having insert grooves on opposite edges thereof to respectively accommodate the free end of each side portion.

13. A display device comprising:
    a curved display panel;
    a curved lower frame configured to accommodate the display panel, the lower frame comprising:
       a first bottom portion having a curvature corresponding to the curved display panel, the first bottom portion having a free edge;
       a second bottom portion having a curvature corresponding to the curved display panel, the second bottom portion having a free edge;
       first to third side portions orthogonally extending from remaining edge portions of the first bottom portion, the first and third side portions each having one free end; and
       fourth to sixth side portions orthogonally extending from remaining edge portions of the second bottom portion, the fourth and sixth side portions each having one free end;
       a first connecting unit configured to accommodate the free edges of the first and second bottom portions to connect the first and second bottom portions to each other via the first connecting unit;
       a second connecting unit orthogonally extending from a first end of the first connecting unit, the second connecting unit configured to accommodate the free ends of the first and fourth side portions to connect the first and fourth side portions to each other via the second connecting unit; and
       a third connecting unit orthogonally extending from a second end of the first connecting unit, the third connecting unit configured to accommodate the free ends of the third and sixth side portions to connect the third and sixth side portions to each other via the third connecting unit.

14. The display device as set forth in claim 13, the first connecting unit having insert grooves on opposite edges thereof to respectively accommodate the free edge of the first and second bottom portions.

15. The display device as set forth in claim 13, the second connecting unit having insert grooves on opposite edges thereof to respectively accommodate the free ends of the first and fourth side portions; and the third connecting unit having insert grooves on opposite edges thereof to respectively accommodate the free ends of the third and sixth side portion.

16. The display device as set forth in claim 13, the first connecting unit having a curvature corresponding to the curved display.

\* \* \* \* \*